United States Patent
Isono et al.

(10) Patent No.: US 6,542,021 B2
(45) Date of Patent: Apr. 1, 2003

(54) HIGH FREQUENCY SWITCH AND COMMUNICATION APPARATUS WITH A HIGH FREQUENCY VOLTAGE DIVIDER

(75) Inventors: Hiroshi Isono, Yokosuka (JP); Kaoru Ishida, Shijonawate (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/759,452

(22) Filed: Jan. 16, 2001

(65) Prior Publication Data

US 2001/0009387 A1 Jul. 26, 2001

(30) Foreign Application Priority Data

Jan. 20, 2000 (JP) ........................................ 2000-012285

(51) Int. Cl.[7] .............................................. H03K 17/00
(52) U.S. Cl. ...................................... 327/365; 333/101
(58) Field of Search ................................ 327/365, 493, 327/503, 504; 455/78, 82, 83; 333/101, 103, 104

(56) References Cited

U.S. PATENT DOCUMENTS 5,507,011 A * 4/1996 Chicodo et al. ............... 455/82
5,742,212 A * 4/1998 Kato et al. ................... 333/104
5,748,054 A * 5/1998 Tonegawa et al. ........... 333/104
5,914,544 A * 6/1999 Tanaka et al. ............... 327/113

FOREIGN PATENT DOCUMENTS

| EP | 0 928 038 | 7/1999 |
| JP | 197042 | 7/1994 |
| JP | 11-55002 | 2/1999 |

* cited by examiner

Primary Examiner—Kenneth B. Wells
(74) Attorney, Agent, or Firm—Smith, Gambrell & Russell, LLP

(57) ABSTRACT

The invention relates to a high frequency switch used in a communication apparatus or the like, such as a portable terminal. The switch includes a first signal terminal, a first diode, the cathode of which is directly or indirectly connected to the first signal terminal, a bias controlling device having an end which is connected to the anode of the first diode, a second signal terminal directly or indirectly connected to the anode of the first diode, an impedance converting device having an end which is directly or indirectly connected to the first signal terminal, a serial circuit having a high frequency voltage dividing device and a second diode, the serial circuit being connected to the other end of the impedance converting device, and a third signal terminal directly or indirectly connected to the other end of the impedance converting device.

3 Claims, 6 Drawing Sheets

HIGH FREQUENCY SWITCH AND COMMUNICATION APPARATUS WITH A HIGH FREQUENCY VOLTAGE DIVIDER

BACKGROUND OF THE INVENTION

1. Field of the Invention

The present invention relates to a high frequency switch used in a communication apparatus and the like, such as a portable terminal.

2. Related Art of the Invention

An example of a prior art high frequency switch is described in Japanese Laid-Open Patent Publication No. Hei 6-197039.

FIG. 5 is a schematic diagram of a prior art high frequency switch. In FIG. 5, numerals 63, 64 and 65 are capacitors. Numeral 66 is a first strip line. Numeral 67 is a capacitor. Numerals 68 and 69 are resistors. Numeral 71 is a first diode. Numeral 72 is a second strip line. Numeral 70 is a second diode. Numeral 73 is a capacitor. Numerals 74 and 76 are resistors. Numeral 75 is a first control terminal. And, numeral 77 is a second control terminal.

The operation of a prior art high frequency switch having such a configuration is as follows. First, in the case that TX is connected to ANT, a voltage is provided to the first control terminal 75, whereby the first diode 71 and the second diode 70 become ON, whereby TX and ANT are connected. At that time, because of the ON state of the second diode 70, the impedance from TX through the second strip line 72 to RX becomes infinity, whereby no high frequency signal flows to RX when TX is connected to ANT.

Next, in the case that RX is connected to ANT, a voltage is provided to the second control terminal 77, whereby the first diode 71 and the second diode 70 are provided with an inverse bias. Accordingly, a fault switching, does not occur even when a high power signal is input in the normal direction of the diode.

A prior art high frequency switch is as described above. However, in case that a higher power is provided in the prior art configuration, a higher current in the normal direction of each diode 70, 71 is necessary in order to connect TX to ANT. Further, a higher inverse voltage between the anode and the cathode of each diode 70, 71 is necessary in order to satisfy distortion characteristics when RX is connected to ANT.

Here, in order to increase the inverse voltage between the anode and the cathode of each diode 70, 71, it is possible to add an inverse bias circuit composed of resistors 74, 76 and the like. However, this causes a larger circuit scale of the switch, and hence is not advantageous for the use in a small portable terminal and the like, such as a cellular telephone and a PHS.

Further, in the configuration that a circuit other than a diode element (second diode 70) is directly connected on the RX side as shown in the prior art example of the inverse bias circuit composed of the resistors 74, 76 and the like, the isolation possibly degrades when TX is connected to ANT, because an ideal short circuit is not obtained by the ON state of each diode 70, 71.

SUMMARY OF THE INVENTION

The present invention has been devised considering such problems. An object of the present invention is to provide a high frequency switch workable on a single power supply, capable of switching without fault switching, and capable of avoiding the degradation of isolation.

One aspect of the present invention is a high frequency switch, comprising:
  a first signal terminal;
  a first diode the cathode of which is directly or indirectly connected to said first signal terminal;
  bias controlling means an end of which is connected to the anode of said first diode;
  a second signal terminal directly or indirectly connected to the anode of said first diode;
  impedance converting means an end of which is directly or indirectly connected to said first signal terminal;
  a serial circuit having high frequency voltage dividing means of dividing high frequency voltage and a second diode, the serial circuit being connected to the other end of said impedance converting means; and
  a third signal terminal directly or indirectly connected to said other end of said impedance converting means; wherein
  the switching on/off of said bias controlling means implements the conduction between said first signal terminal and said second signal terminal or the conduction between said first signal terminal and said third signal terminal.

Another aspect of the present invention is the high frequency switch of one aspect, comprising short-circuit implementing means connected to the cathode of said second diode for canceling a parasitic component during transmission.

Still another aspect of the present invention is the high frequency switch of one or another aspect, comprising isolation improving means connected to said first diode in parallel.

Still yet another aspect of the present invention is the high frequency switch of any one of one to still another aspects, said high frequency voltage dividing means comprising at least a diode the anode of which is directly or indirectly connected to the cathode of said second diode in series.

A further aspect of the present invention is the high frequency switch of any one of one to still yet another aspects, said high frequency voltage dividing means comprising a resistor directly or indirectly connected to the cathode of said second diode in series.

A still further aspect of the present invention is the high frequency switch of any one of one to still another aspects, said high frequency voltage dividing means being a parallel circuit composing at least a diode the cathode of which is grounded and a resistor.

A yet further aspect of the present invention is the high frequency switch of another aspect, said short-circuit implementing means comprising at least a capacitor.

A still yet further aspect of the present invention is the high frequency switch of another aspect, said isolation improving means comprising at least an inductor and/or at least a capacitor.

An Additional aspect of the present invention is a communication apparatus comprising a high frequency switch of any one of one to a still yet further aspects.

In such a high frequency switch of the present invention, each anode of a first diode and a second diode is connected to the side of a bias control terminal, whereby workability on a single power supply is achieved. Resonance circuits are connected to the first diode and the second diode in order to eliminate the parasitic component of the diodes, whereby the isolation of the switch is improved. High frequency voltage dividing means connected to the first resonance circuit in parallel divides the voltage supplied on the diode into a lower voltage, whereby the distortion characteristics of the diode is improved. Accordingly, fault switching does not occur even when a high power signal is input in the normal direction during the OFF duration of the diode.

DESCRIPTION OF THE REFERENCE NUMERALS

Figure 1:
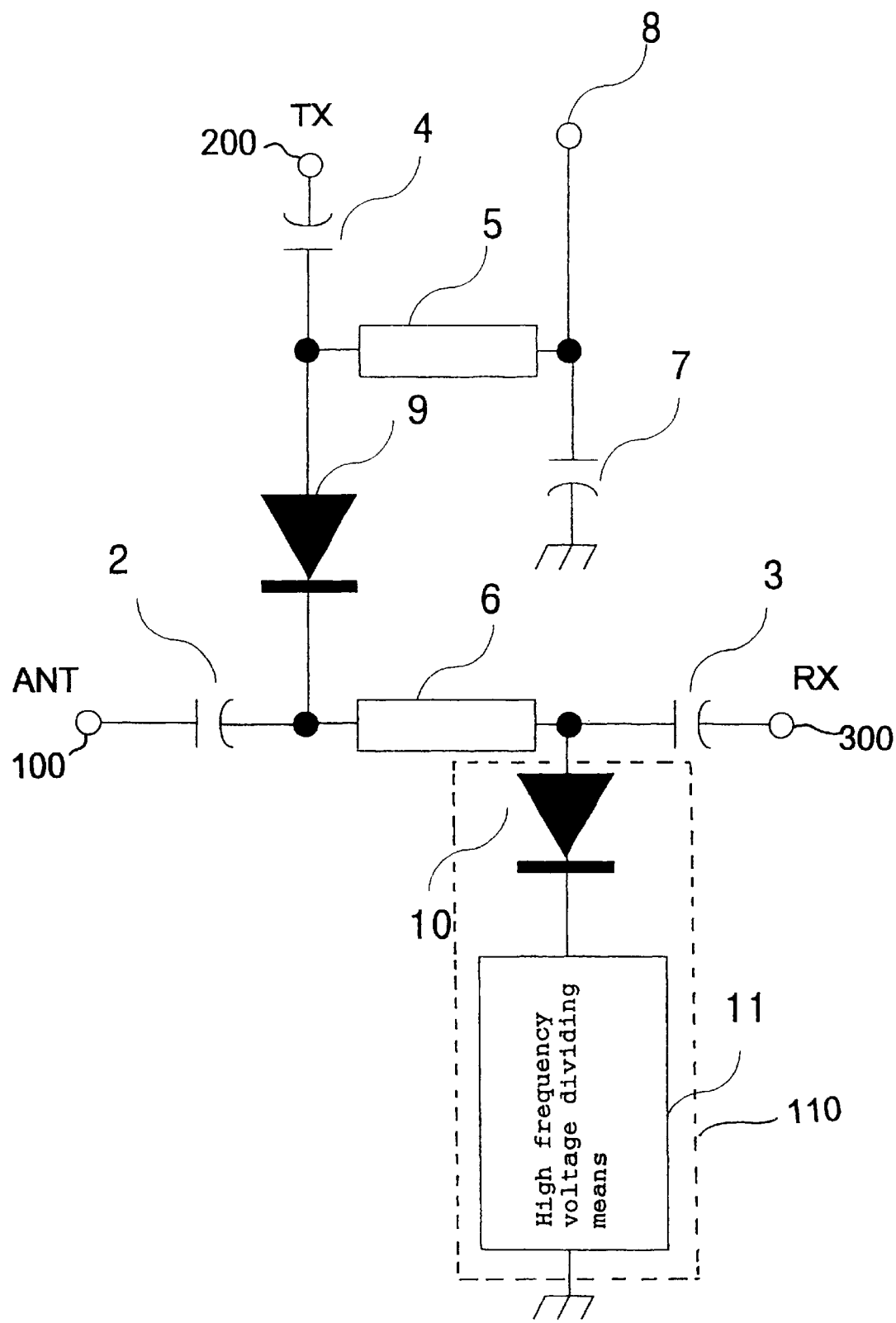
FIG. 1 is a block diagram of a high frequency switch in accordance with Embodiment 1 of the present invention.

1 High frequency switch
2, 3, 4, 7 Capacitor
5, 6 Transmission line
8 Control terminal
9, 10 Diode
11 High frequency voltage dividing means
100 ANT terminal
200 TX terminal
300 RX terminal

PREFERRED EMBODIMENTS OF THE INVENTION

The embodiments of a high frequency switch of the present invention are described below with reference to the drawings.

(Embodiment 1)

Embodiment 1 of a high frequency switch of the present invention is described below with reference to FIG. 1. FIG. 1 is a circuit block diagram of a high frequency switch of the embodiment. In the figure, numeral 1 designates a high frequency switch of Embodiment 1. Numerals 2, 3 and 4 are capacitors. Numerals 5 and 6 are transmission lines corresponding to impedance converting means. Numeral 7 is a capacitor. Numeral 8 is a control terminal for supplying a bias voltage. Numeral 9 is a first diode. Numeral 10 is a second diode. Numeral 11 is high frequency voltage dividing means. Numeral 110 is a serial circuit having the second diode 10 and the high frequency dividing means 11. Numeral 100 is an ANT terminal corresponding to a first signal terminal of the present invention. Numeral 200 is a TX terminal corresponding to a second signal terminal of the present invention. And, numeral 300 is an RX terminal corresponding to a third signal terminal of the invention.

Bias controlling means of the present invention corresponds to the circuit composed of the transmission line 5, the capacitor 7, and the control terminal 8.

The operation in the embodiment having the above-mentioned configuration is as follows.

First, in the case that the ANT terminal 100 is connected to the TX terminal 200, a predetermined voltage is provided to the control terminal 8, thereby causing the same operation as the prior art example.

Next, in the case that the ANT terminal 100 is connected to the RX terminal 300, the voltage provided on the control terminal 8 is set to 0 V. In this case, the first diode 9 and the second diode 10 become OFF. When a high power signal is input through the ANT terminal 100 in this state, the voltage to be provided on the diode 10 is divided into a lower voltage by the high frequency voltage dividing means 11. This suppresses the occurrence of distortion, thereby avoiding the occurrence of fault switching.

The above-mentioned description has been made for the case in which the high frequency voltage dividing means 11 of the serial circuit 110 is provided between the cathode of the second diode 10 and the ground. However, the high frequency voltage dividing means 11 may be inserted between the anode of the second diode 10 and the connection point thereof to the transmission line 6. That is, the necessary condition is that a high frequency voltage dividing means of the present invention composes a serial circuit of the present invention together with the second diode 10 so as to be capable of dividing the voltage to be provided on the second diode 10.

(Embodiment 2)

Figure 2A:
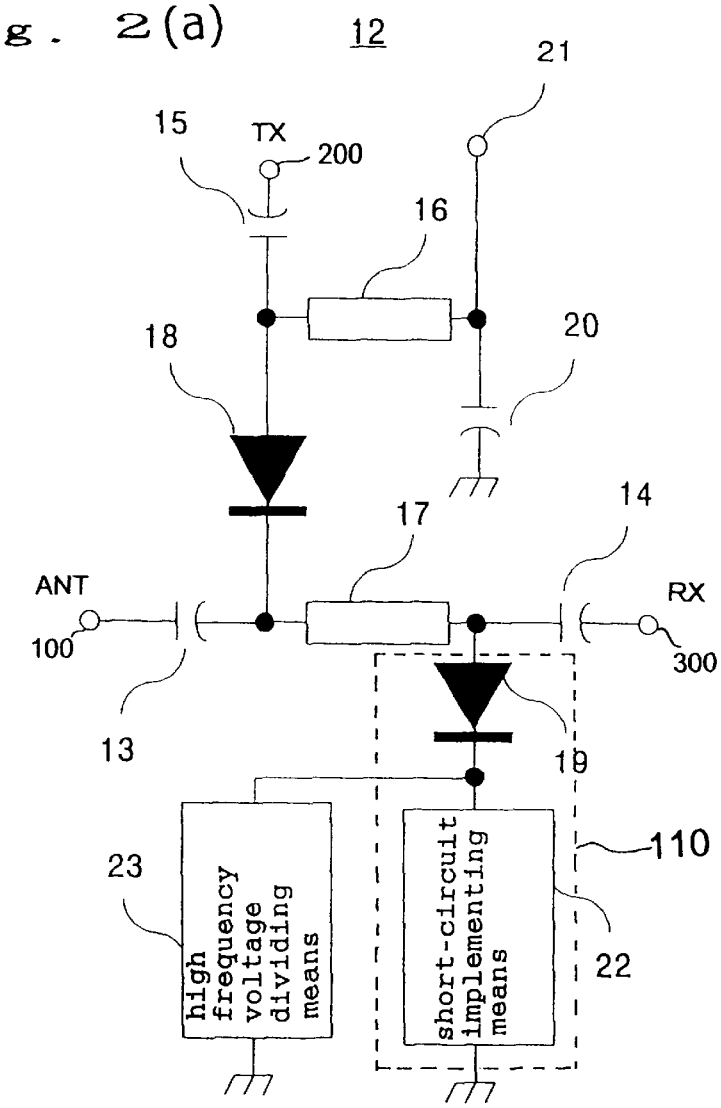
FIG. 2(a) is a block diagram of a high frequency switch provided with a diode and short-circuit implementing means comprising at least an inductor and/or a capacitor in accordance with Embodiment 2 of the present invention.

A high frequency switch of Embodiment 2 of the present invention is described below with reference to FIG. 2. FIG. 2 is a circuit block diagram of a high frequency switch of the embodiment. In the figure, numeral 12 designates a high frequency switch of Embodiment 2. Numerals 13, 14 and 15 are capacitors. Numerals 16 and 17 are transmission lines corresponding to impedance converting means. Numeral 20 is a capacitor. Numeral 21 is a control terminal for supplying a bias voltage. Numeral 18 is a first diode. Numeral 19 is a second diode. Numeral 22 is short-circuit implementing means. And, numeral 23 is high frequency voltage dividing means. Bias controlling means of the present invention corresponds to the circuit composed of the transmission line 16, the capacitor 20, and the control terminal 21.

The operation in the embodiment having the above-mentioned configuration is as follows.

First, in the case that an ANT terminal 100 is connected to a first TX terminal 200, a predetermined voltage is provided to the control terminal 8, thereby causing the first diode 18 and the second diode 19 to be ON. At that time, the second diode 19 generates a serial resonance with the short-circuit implementing means 22 connected in series, whereby the parasitic component is canceled, and an ideal short-circuit state is achieved.

Next, in the case that the ANT terminal 100 is connected to the RX terminal 300, the operation is carried out similarly to that of Embodiment 1.

As such, in accordance with the present embodiment, the isolation between the ANT terminal 100 and a second RX terminal 300 can be improved.

Figure 2B:
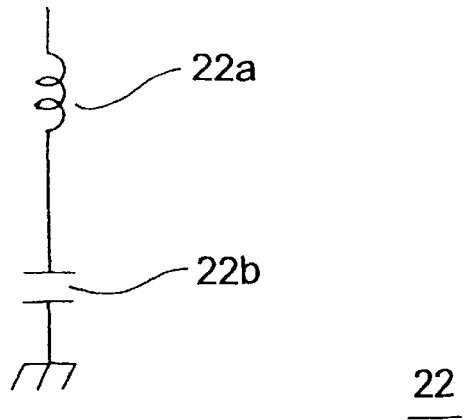
FIG. 2(b) is a circuit diagram showing an example of a specific configuration of short-circuit implementing means.

Here, the short-circuit implementing means 22 may be any circuit capable of forming a resonance circuit in cooperation with the second diode 19. A circuit of any appropriate combination of diodes, inductors and capacitors may be used for this means depending on the situation. For example, the short-circuit implementing means 22 may be a serial circuit consisting of an inductor 22a and a capacitor 22b as shown in FIG. 2(b). The means may be implemented by a circuit consisting of a capacitor 22b alone. As such, short-circuit implementing means 22 of the present invention is preferably composed of at least a capacitor.

(Embodiment 3)

Figure 3A:
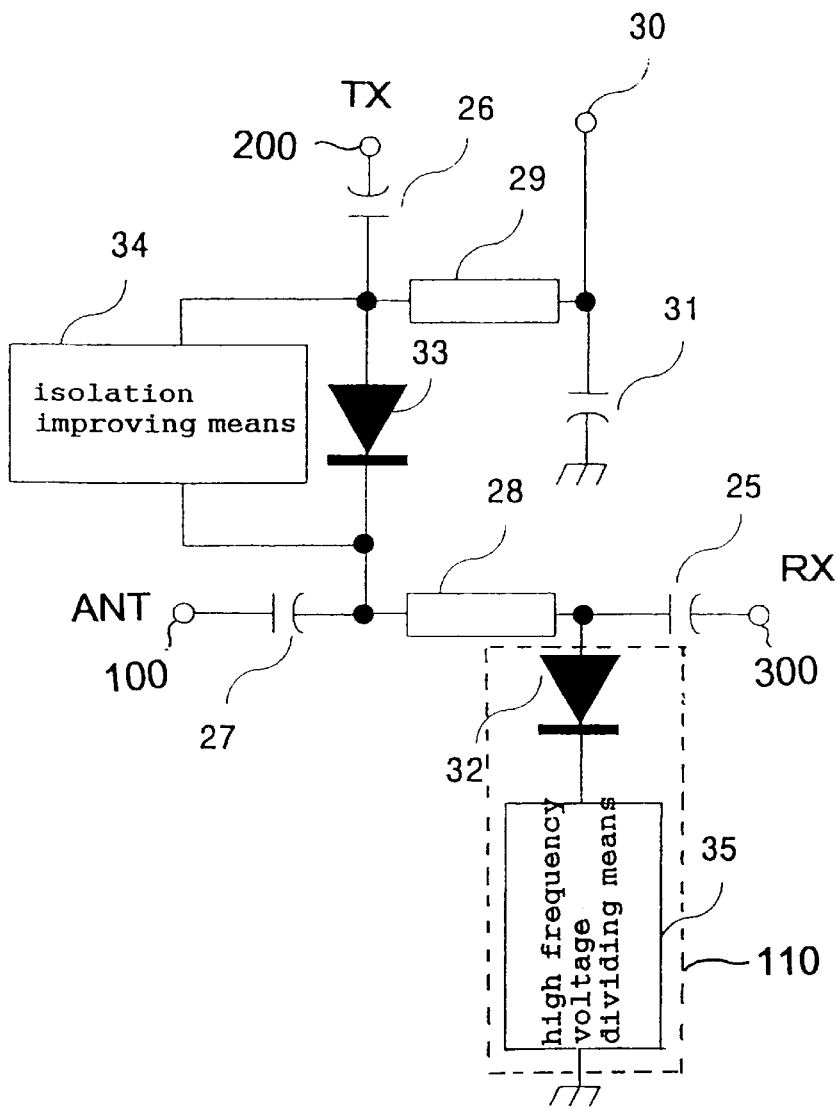
FIG. 3(a) is a block diagram of a high frequency switch provided with isolation improving means for a diode in accordance with Embodiment 3 of the present invention.

A high frequency switch of Embodiment 3 of the present invention is described below with reference to FIG. 3. FIG. 3 is a circuit block diagram of a high frequency switch of the embodiment. In the figure, numeral 24 designates a high frequency switch of Embodiment 3. Numerals 25, 26 and 27 are capacitors. Numerals 28 and 29 are transmission lines corresponding to impedance converting means. Numeral 31 is a capacitor. Numeral 30 is a control terminal for supplying a bias voltage. Numeral 32 is a first diode. Numeral 33 is a second diode. Numeral 34 is isolation improving means. And, numeral 35 is high frequency voltage dividing means. Bias controlling means of the present invention corresponds to the circuit composed of the transmission line 29, the capacitor 31, and the control terminal 30.

The operation in the embodiment having the above-mentioned configuration is as follows.

First, in the case that the ANT terminal 100 is connected to the TX terminal 200, a predetermined voltage is provided to the control terminal 30, thereby causing the same operation as the prior art example.

Next, in the case that the ANT terminal 100 is connected to the RX terminal 300, the voltage provided on the control terminal 30 is set to 0 V. In this case, the first diode 33 and the second diode 32 become OFF. At that time, the first diode 33 generates a parallel resonance with the isolation improving means 34 connected in parallel, whereby the isolation between the ANT terminal 100 and the TX terminal 200 is improved.

As such, in accordance with the present embodiment, the isolation between the ANT terminal 100 and the TX terminal 200 can be improved.

Figure 3B:
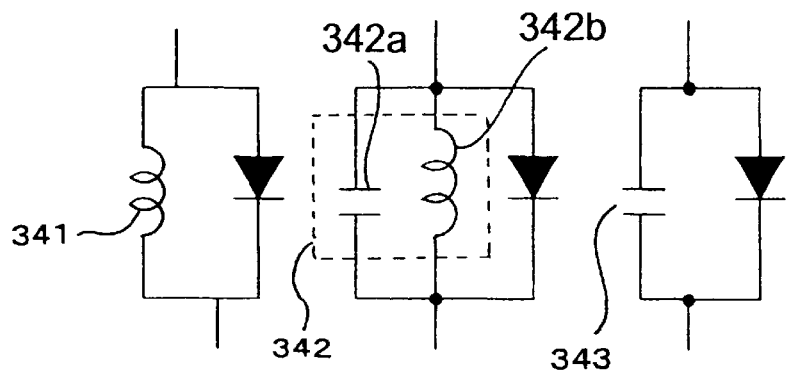
FIG. 3(b) is a circuit diagram showing examples of a specific configuration of isolation improving means.

Here, the isolation improving means 34 may be any circuit connected to the first diode 33 in parallel and capable of forming a resonance circuit in cooperation therewith. Example circuits usable as an isolation improving means 34 depending on the situation include: an inductor 341 connected in parallel with the diode 33; a parallel circuit 342 consisting of a capacitor 342a and an inductor 342b; and a capacitor 343; each connected in parallel with the diode 33 as shown in FIG. 3(b). As such, isolation improving means of the invention is preferably composed of at least an inductor and/or at least a capacitor.

(Embodiment 4)

Figure 4A:
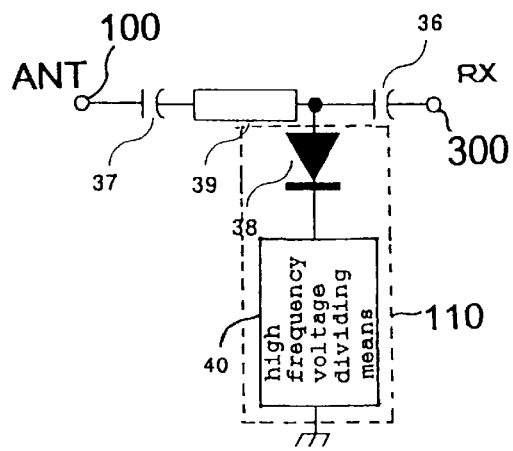
FIGS. 4(a) through 4(e) are circuit diagrams showing examples of a configuration of a high frequency voltage dividing means in accordance with Embodiment 4 of the present invention.
Figure 4B:
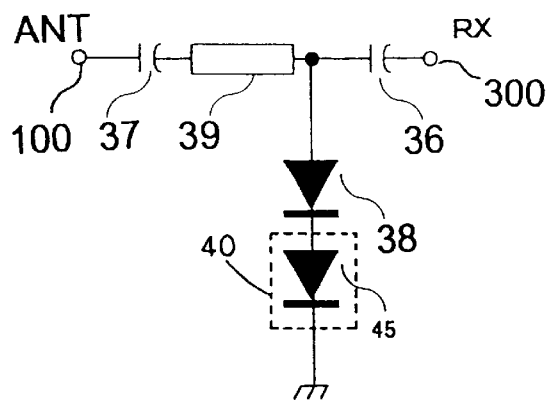
Figure 4C:
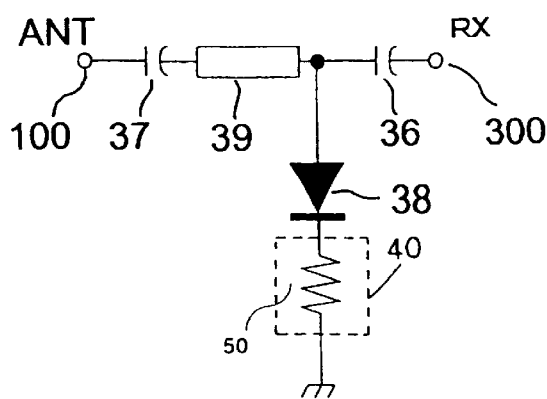
Figure 4D:
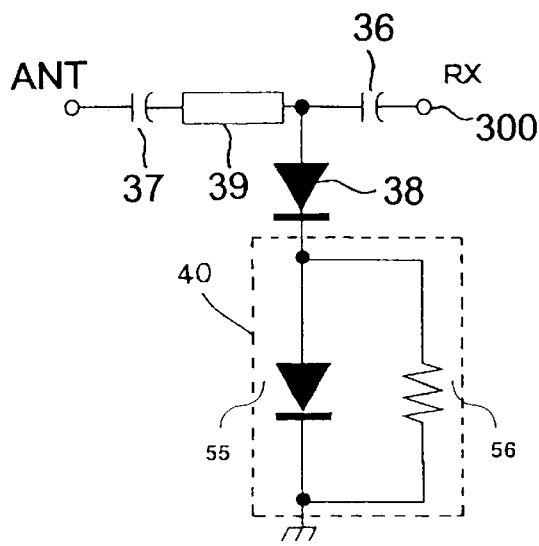
Figure 4E:
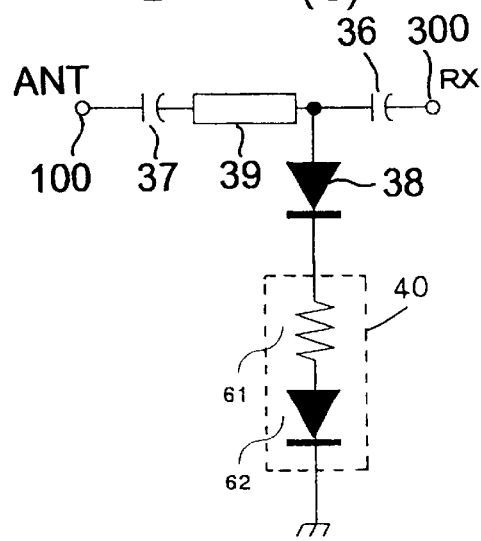
Figure 5:
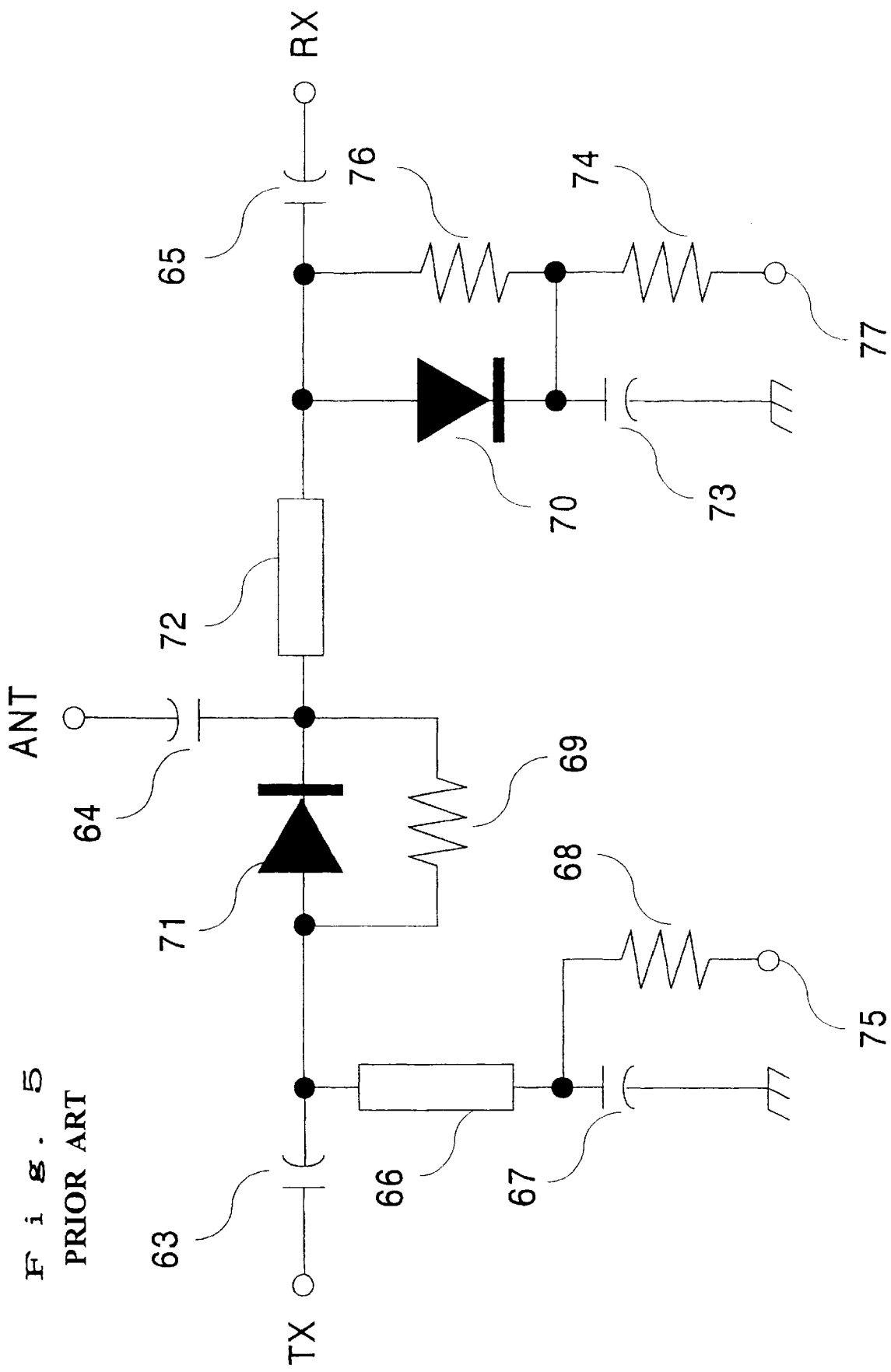
FIG. 5 is a block diagram of a high frequency switch in accordance with a prior art.
Figure 6:
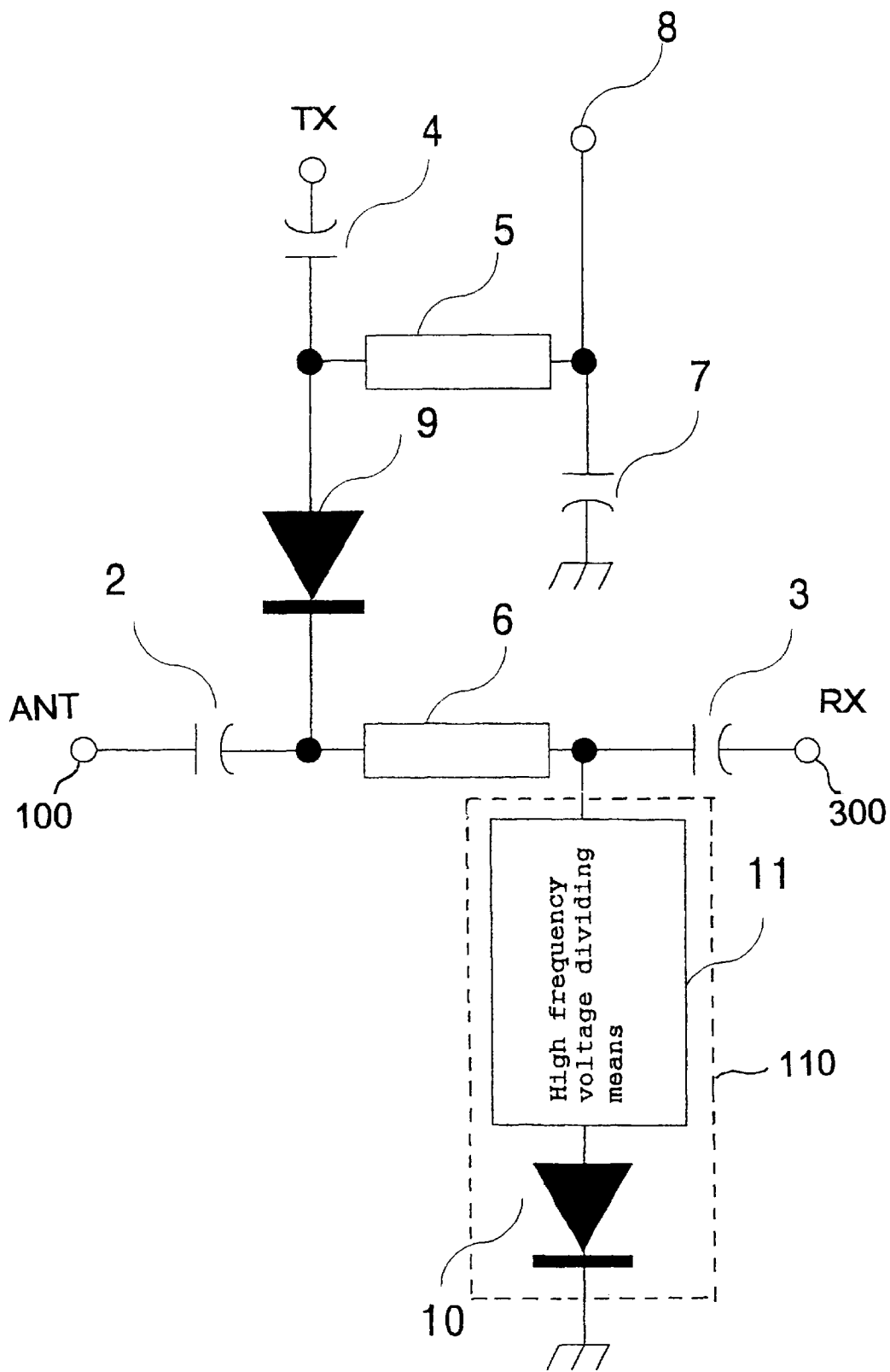
FIG. 6 is a block diagram of another exemplary configuration of a high frequency switch in accordance with Embodiment 1 of the present invention.

A high frequency switch of Embodiment 4 of the invention is described below with reference to FIGS. 4(a) through 4(e). FIG. 4(a) is a partial circuit block diagram showing the part from the common ANT terminal 100 to the second RX terminal 300 of FIG. 1 used for the description of Embodiment 1. That is, the part from the ANT terminal 100 to the first TX terminal 200 is omitted. FIGS. 4(b) to 4(e) are circuit block diagrams showing a high frequency voltage dividing means 40 (equivalent to the high frequency voltage dividing means 11 of FIG. 1) having various configurations. In FIGS. 4(a) to 4(e), numerals 36 and 37 are capacitors. Numeral 38 is a second diode (equivalent to the second diode 10 of FIG. 1). Numeral 40 is a high frequency voltage dividing means. Numeral 110 is a serial circuit having the second diode 38 and the frequency voltage dividing means 40. And, numeral 39 is a transmission line of impedance converting means. In FIG. 4(b), numeral 45 is a diode. In FIG. 4(c), numeral 50 is resistor. In FIG. 4(d), numeral 55 is a diode, and numeral 56 is a resistor. In FIG. 4(e), numeral 61 is a resistor, and numeral 62 is a diode.

The operation in the embodiment having the above-mentioned configuration is as follows.

In an exemplary configuration of the high frequency voltage dividing means 40 shown in FIG. 4(b), a diode 45 is connected to a second diode 38 in series, whereby the voltage is divided. Here, two or more diodes may be connected in series. The voltage to be provided on the second diode 38 is divided depending on the number of diode(s) connected, whereby the distortion characteristics is further improved.

In an exemplary configuration of the high frequency voltage dividing means 40 shown in FIG. 4(c), a resistor 50 is connected to a second diode 38 in series, whereby a similar effect to that of the configuration example of FIG. 4(b) is obtained. Similarly to the above-mentioned configuration example, two or more resistors may be connected in series, whereby a similar effect is obtained.

The high frequency voltage dividing means 40 may be implemented by a parallel circuit consisting of a diode 55 and a resistor 56 as shown in FIG. 4(d). Further, the means may be implemented by a serial circuit consisting of a resistor 61 and a diode 62 as shown in FIG. 4(e). In both cases, a similar effect to that of the above-mentioned configuration example is obtained. Here, similarly to the Embodiment 1, it is sufficient that the high frequency voltage dividing means 40 is composes a serial circuit of the present invention together with the second diode 38. Thus, instead that the means is provided between the cathode of the second diode 38 and the ground, the means may be inserted between the anode of the second diode 38 and the connection point thereof to the transmission line 39.

A high frequency switch in accordance with each above-mentioned embodiment permits the miniaturization of a communication apparatus and the reduction of the power consumption thereof.

The description of each above-mentioned embodiment has been made for the case that each impedance converting means of the present invention corresponds a strip line 5, 16, 29. However, the configuration of the present invention is not restricted to this. That is, any configuration capable of converting the impedance may be used as the impedance converting means.

The description of each above-mentioned embodiment has been made for the case that the high frequency switch comprises capacitors 2, 3, 4, 13, 14, 15, 25, 26, 27, 36, 37. However, these capacitors may be omitted in a high frequency switch of the invention.

As is understood from the above-mentioned description, the present invention provides a high isolation. Further, since distortion characteristics is improved without an inverse bias circuit, the invention permits the miniaturization of a circuit and the reduction of the current consumption thereof.

What is claimed is:

1. A high frequency switch comprising:
   a first signal terminal;
   a first diode, the cathode of which is directly or indirectly connected to said first signal terminal;
   bias controlling means having an end which is connected to the anode of said first diode;

a second signal terminal directly or indirectly connected to said anode of said first diode;

impedance converting means having an end which is directly or indirectly connected to said first signal terminal;

a serial circuit having high frequency voltage dividing means and a second diode, said serial circuit being connected to the other end of said impedance converting means; and a third signal terminal directly or indirectly connected to said other end of said impedance converting means, wherein switching on/off of said bias controlling means implements conduction between said first signal terminal and said second signal terminal or conduction between said first signal terminal and said third signal terminal, said high frequency voltage dividing means includes at least a diode, the anode of which is directly or indirectly connected to the cathode of said second diode in series, and said second diode is connected with said first signal terminal and said third signal terminal in parallel.

2. The high frequency switch comprising:

a first signal terminal;

a first diode, the cathode of which is directly or indirectly connected to said first signal terminal;

bias controlling means having an end which is connected to the anode of said first diode;

a second signal terminal directly or indirectly connected to said anode of said first diode;

impedance converting means having an end which is directly or indirectly connected to said first signal terminal;

a serial circuit having high frequency voltage dividing means and a second diode, said serial circuit being connected to the other end of said impedance converting means; and a third signal terminal directly or indirectly connected to said other end of said impedance converting means, wherein switching on/off of said bias controlling means implements conduction between said first signal terminal and said second signal terminal or conduction between said first signal terminal and said third signal terminal, and said high frequency voltage dividing means is a parallel circuit composing at least a diode, the cathode of which is grounded, and a resistor.

3. A communication apparatus comprising a high frequency switch of claims 1 or 2.

* * * * *